United States Patent [19]

Laube

[11] Patent Number: 5,660,640
[45] Date of Patent: Aug. 26, 1997

[54] METHOD OF REMOVING SPUTTER DEPOSITION FROM COMPONENTS OF VACUUM DEPOSITION EQUIPMENT

[75] Inventor: David P. Laube, Mesa, Ariz.

[73] Assignee: Joray Corporation, Phoenix, Ariz.

[21] Appl. No.: 491,154

[22] Filed: Jun. 16, 1995

[51] Int. Cl.$^6$ ............................ B08B 3/12; G23G 1/02
[52] U.S. Cl. .................... 134/1; 134/2; 134/3; 134/7; 134/28; 134/29; 134/41; 216/108
[58] Field of Search .................... 134/1, 2, 1.3, 3, 134/7, 28, 29, 41; 216/83, 108

[56] References Cited

U.S. PATENT DOCUMENTS

| | | | |
|---|---|---|---|
| 2,734,837 | 2/1956 | Hands | 216/108 |
| 3,024,095 | 3/1962 | Fincham | 216/108 X |
| 3,121,026 | 2/1964 | Beigay | 134/29 X |
| 3,553,015 | 1/1971 | Dohogne | 134/29 X |
| 3,788,914 | 1/1974 | Gumbelevicius | 216/108 X |
| 5,290,362 | 3/1994 | Sue | 134/2 |
| 5,308,400 | 5/1994 | Chen | 134/28 X |
| 5,464,031 | 11/1995 | Buley et al. | 134/1 |
| 5,489,557 | 2/1996 | Jolley | 134/28 X |
| 5,509,971 | 4/1996 | Kirschner | 134/7 |

*Primary Examiner*—Jill Warden
*Assistant Examiner*—Saeed Chaudhry
*Attorney, Agent, or Firm*—Joseph H. Roediger

[57] ABSTRACT

A method for removing deposited material from vacuum deposition equipment is disclosed. The method utilizes a low temperature bath, between 40–50 degrees F., to strip sputter depositions, followed by an acid etch step using a low concentration of hydrofluoride acid to remove trace contamination from the surface. Following removal of deposited material, surface texturing of the components is provided.

14 Claims, 1 Drawing Sheet

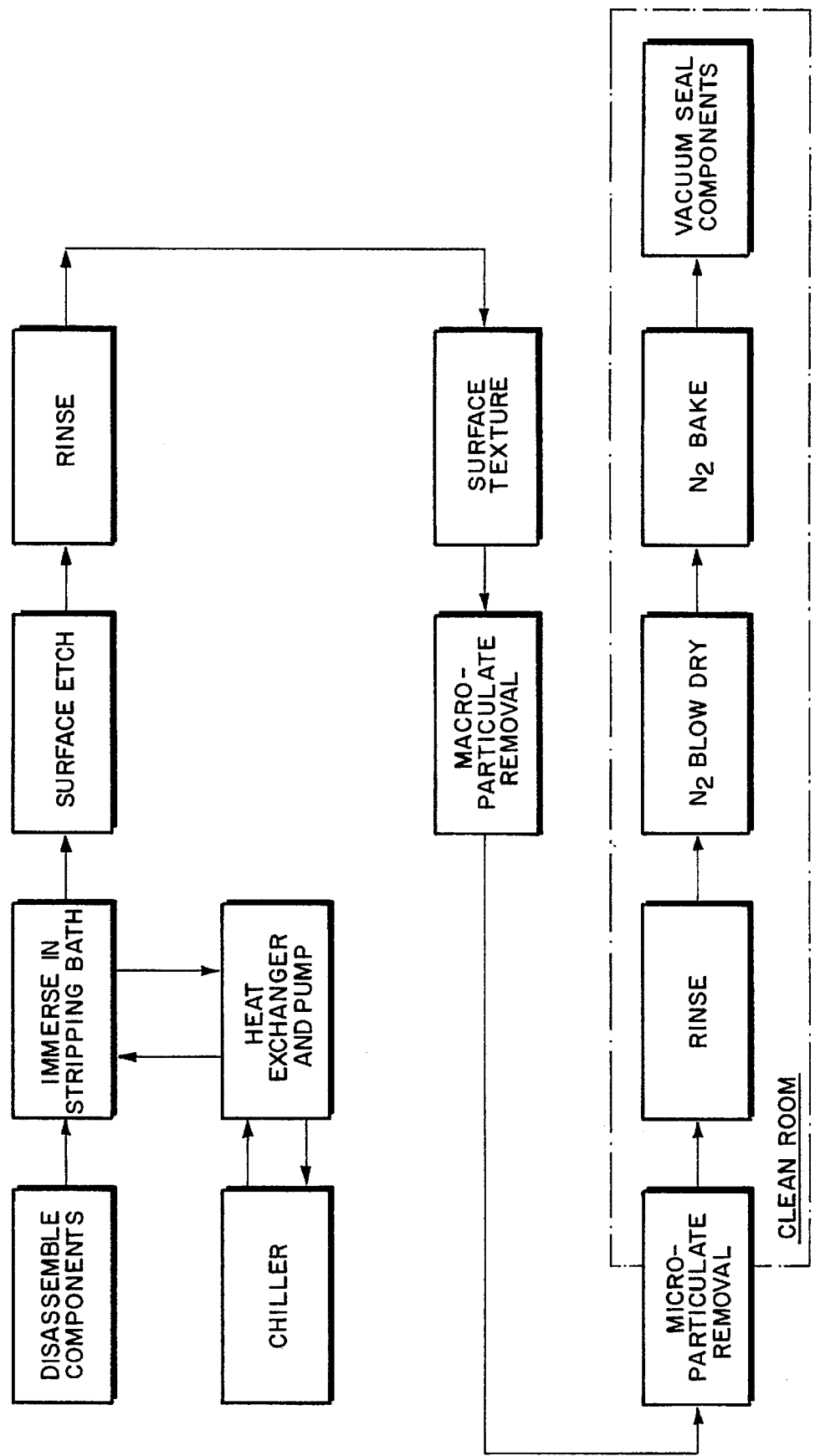

METHOD OF REMOVING SPUTTER DEPOSITION FROM COMPONENTS OF VACUUM DEPOSITION EQUIPMENT

BACKGROUND OF THE INVENTION

This invention relates to a method for cleaning the disassembled components of vacuum deposition equipment of deposited materials and, more particularly, is directed to an efficacious method for the removal of sputtered titanium materials from ultra high vacuum equipment used in semiconductor manufacturing.

It is well recognized that both equipment and material cleanliness are necessary conditions in order to avoid low production yields in the manufacture of integrated circuits. For example, an entire microelectronics circuit is ruined by a single defect. A defect caused by a contaminant particle introduced at any of a number of points in the process will either create a defective product that is immediately recognizable as such, or result in the production of a circuit that fails shortly after being placed into use.

Conditions for cleanliness are established early on in the manufacturing process beginning with the preparation of the semiconductor wafer upon which a multiplicity of processing steps are performed. The variety of steps include diffusion, sputtering and evaporation techniques. During the time that the fabrication of the circuits in the wafers is taking place, extreme care is taken to ensure that the operating environment is clean. To that end, considerable attention is paid to the maintenance of clean equipment. Not only are safeguards taken to prevent the introduction of external impurities, but the equipment is also periodically disassembled into its component parts in order to remove previously deposited process materials. The presence of process material build-up in the vacuum chambers can result in the uncontrolled presence of these materials on the microelectronic circuits and can be as ruinous to the circuit as external containments.

Consequently, the processing equipment is routinely taken apart according to schedule, typically a use cycle of approximately one thousand wafer depositions, and subjected to a variety of treatments which attempt to restore the equipment to initial condition. In the case of sputtering equipment wherein titanium and titanium compounds are pattern deposited on the surface of the circuitry being fabricated, the sputter particles migrate throughout the entire chamber and end up being deposited on all exposed surfaces. The failure to thoroughly clean the equipment components within the chamber on a periodic basis is likely to result in the spalling and flaking of deposited material. The result of unpredictable movement of deposited materials in the chamber on to the exposed wafer surface is a reduction in the manufacturing yield caused by an increase in the number of defects in the circuitry produced.

One method of cleaning the components presently used in the fabrication process utilizes a stripping bath containing approximately equal parts of nitric acid, hydrofluoric acid and deionized water. The hydrofluoric acid provides a cleaning and etching effect to the surfaces of the components while the nitric acid promotes the solubility of deposited metal and metal compounds. The two acids provide complimentary action and act more rapidly at an elevated bath temperature. Considerable care must be taken to ensure that the welds of the treated structural components are not weakened by the effects of the hydrofluoric acid. Thus, a balance is attempted to be maintained between reducing the hydrofluoric acid ratio and the temperature of the bath. The reducing of the bath temperature produces a corresponding reduction in the activity of the acid bath thereby requiring a longer immersion time to achieve the same stripping effect.

Following the stripping of deposited materials, the components are normally subjected to a power wash which removes macro and micro particles that tend to remain on the surface of the components. The wash typically uses deionized water and precedes a drying step. The drying occurs in an oven provided with an inert gas environment. At the completion of the drying, the components are reassembled in the sputtering chamber and the manufacturing process is resumed.

In practice, the above-described cleaning process is frequently found insufficient to permit the component to be reinstalled without being subjected again to the process. As mentioned, the foregoing process has the capability of shortening the usable life time of the components since a strong hydrofluoric acid bath tends to weaken the structural integrity of the component.

Accordingly, the present invention is directed to a controllable method of cleaning components of semiconductor fabrication equipment which utilizes a low temperature bath for stripping of deposited materials. In addition, the subject method utilizes a stripping bath that does not include hydrofluoric acid. Another objective of the invention is the provision of a method of cleaning which prepares the surface of the treated components to receive deposited material in an adhering manner when the equipment is again placed in use.

SUMMARY OF THE INVENTION

The method of the present invention is a process for the removal of deposited material from equipment components used in the manufacture of microelectronic circuits and is particularly concerned with the removal of deposited material occurring during vacuum deposition processes. The method includes the initial step of immersing disassembled components in a low temperature aqueous bath containing a stripping agent which includes ammonium hydroxide and hydrogen peroxide. The action of the stripping agent on the deposited materials is an exothermic reaction tending to elevate the temperature of the aqueous bath. Elevation of the bath temperature promotes the stripping reaction and can lead to uncontrolled stripping and the production of an ammonia cloud in the facility. As a result, the bath is maintained at a temperature below ambient by the use of suitable heat removal equipment during the immersion interval. After the stripping process has been completed, the components are removed from the bath and then acid etched to provide a uniform surface appearance and to remove any trace of contamination from the surfaces thereof. The etching solution contains a low concentration of hydrofluoric acid to thereby limit the amount of material removed. Following acid etching, the components are rinsed and pressure flushed with the deionized water.

By utilizing a stripping agent that omits hydrofluoric acid, the possibility oil the structural integrity of the components being compromised is significantly reduced. Furthermore, the use of the above-noted stripping agent permits the stripping action to occur at a lower temperature than other agents thereby allowing the rate of removal of material to be carefully controlled.

The present process provides a thorough cleaning of the surface of the components which normally enables them to be reassembled and used after a single cleaning. To enhance the performance of the reassembled components, the present method provides a surface texturing step which calls for the use of grit to produce a degree of surface roughness. The resultant texture imparted to the surface enhances adhesion of later deposited material thereby reducing the likelihood that particles may be unpredictably released in the deposition chamber to later appear on the wafer and reduce manufacturing yield. Following the surface texturing of the components, rinsing with the deionized water takes place to remove particles greater than 10 microns in size. Next, the components can be subjected to an ultrasonic water bath to remove submicron particles.

A rinse followed by blow drying with an inert gas and than a nitrogen bake complete the cleaning process for optimum cleaning effects. The present process provides a reliable and effective method of cleaning components from vacuum deposition equipment and, in particular, components from a sputtering chamber which may have titanium and titanium compounds deposited thereon.

Further features and advantages of the invention will be readily apparent from the following detailed description when taken in conjunction with the accompanying figure showing a process flow diagram.

BRIEF DESCRIPTION OF THE DRAWINGS

The FIGURE is a process flow diagram in block form showing the steps of the present method.

DETAILED DESCRIPTION OF THE PREFERRED EMBODIMENT

In the manufacture of semiconductor microcircuits, it is common to utilize physical and chemical vapor deposition processes to impart a coating to a substrate. In the case of physical vapor deposition, a vapor phase is deposited on the desired substrate, while in the case of chemical vapor deposition, a gas or vapor phase is passed over a substrate and a chemical reaction is initiated. The chemical reaction decomposes the reacted gas to provide a desired coating on the unmasked portions of the substrate. The coating material in these processes is passed into the transport phase by sublimation from a solid source. The source material is heated and the sublimation takes place in a vacuum environment. The use of the vapor phase as the transport phase results in the migration of the source material throughout the process chamber. As a result, the deposition occurs not only on the target but also on components of the process equipment. A buildup of the material deposited on the exposed surfaces of structures adjacent to the target is acceptable up to a point where spalling and flaking of the deposited materials therefrom is likely to occur. These events are unpredictable adding uncertainty to the process since they have the potential to contaminate the work product. As a result, vacuum equipment is periodically taken out of service with the components from within the vacuum chamber being disassembled and then subjected to a cleaning treatment to remove buildup of deposited material. Semiconductor manufacturers have reported replacement of equipment components after three cycles of use, each cycle may include processing of one thousand wafers. In the case of the present method, the cleanings of the equipment components has been increased to 15 or more use cycles before replacement while still maintaining acceptable processing yields for the processed semiconductor products.

The present invention is concerned with the provision of a process for reliably and thoroughly cleaning the components of the sputtering equipment so that the component may be reinstalled and recycled into rise with confidence that they are comparable in cleanliness and structural integrity to the original equipment.

Typically, the target materials used in vacuum sputtering equipment are fabricated of aluminum, stainless steel, titanium, ceramic or quartz. The buildup of deposited material on these components frequently contains titanium or a titanium compound such as titanium nitride or titanium tungsten. Also, the buildup may include the metals aluminum, copper and alloys thereof. In the practice of the present invention, the disassembled components are first immersed in a stripping bath as shown in the FIGURE which outlines the steps of the present method in the flow diagram of the drawing. The bath contains a stripping solution which is well-suited to remove titanium sputter deposition from aluminum and stainless steel equipment components. The particular stripping solution as utilized in the present process removes the built up material with no appreciable stock loss to the substrate. The process utilizes a stripping solution containing 5 to 8% by volume of ammonium hydroxide, 38 to 42% by volume hydrogen peroxide with the balance of the solution being deionized water. It is to be noted that the stripping solution omits as a component, hydrofluoric acid. Heretofore, the stripping solutions have incorporated a fluorine-based acid to aggressively attach the deposited materials. One disadvantage in using a hydrofluoric acid stripping solution has been the attack on the welds of the components reducing the strength of the welds. Over a period of repeated treatments, the components can be weakened so as to be incapable of being reused in the sputtering equipment.

In the present method as shown in the process flow diagram outlined in the FIGURE, the components to be cleaned are immersed in a tank containing the stripping solution as shown in block 11 of the FIGURE. As later discussed, the stripping solution is maintained at a temperature below ambient which permits the stripping rate to be controlled and to prevent substrate attack. The tank is provided with teflon dividers to prevent the components which can range in size from one-half inch to 40 inches from moving about and contacting the cooling coils located at the bottom of the tank. The stripping operation is conducted while the solution is maintained in the range of 40 to 55 degrees F. by use of an in-tank heat exchanger cooled by use of a fluid in a closed loop chilled line supply. The cooling coils in the tank are coupled to an external direct expansion heat exchanger 12 and a pump to form the closed loop for the primary fluid. The external heat exchanger is coupled to an external chiller 14 to remove heat from the circulating fluid so as to maintain the stripping solution below the ambient temperature. Normally, the components are immersed in the stripping solution for a period of ½ to 1 hour. The components are then rinsed in water and subjected to a power flush with deionized water to remove any insoluble and organic residue. This residue is termed smut and ranges in color from brown to dark black. The remaining presence of smut visually indicates when components have been insufficiently or incompletely cleaned whereupon they are reimmersed in the stripping solution. The cycle is continued until the components no longer exhibit the surface characteristics of a smut layer.

After the stripping of the deposited material from the components, the components are moved to a second tank which contains a surface etching solution. The surface etch step 15, noted as such in the drawing, is often referred to as the acid pickling step and is used to create a uniform surface appearance and to remove trace contamination from the surface of the component. This step of the present invention utilizes an etching solution that contains 20 to 32%, by volume nitric acid, 2 to 4% by volume hydrofluoric acid with the balance being deionized water. The low concentration of hydrofluoric acid coupled with an immersion time of one to five minutes does not permit the etching solution to significantly affect the structural integrity of the component nor unduly etch the surfaces thereof. Following the surface etch, the components are rinsed and pressure flush with 80 to 100 psi air atomized deionized water. At this point in the process shown a block 16, the components have been stripped of deposited materials and the surfaces have been prepared to remove any trace contamination.

Since the objective is to provide components that are to be recycled and reused in vacuum equipment, it has been found advantageous to treat the surface of the components further by a texturing step 17. The components are again going to be exposed to vapor phase materials which will be deposited on exposed component surfaces. In order to avoid the low manufacturing yields resulting from the introduction of contaminants to the work piece by flaking and spalling of deposited material, the surface texturing step is used to ensure that deposited material strongly adheres to the surfaces of the components upon which it is deposited.

In the texturing step, all surfaces of the components exposed to the deposition of sputtered material within a sputter chamber are grit blasted to produce a minimum surface roughness. In practice, a surface roughness of approximately 200 micro inches has been found to provide the surface character for strong adherence of deposited material. The abrasive media employed in the preferred embodiment of the invention is 36 grit aluminum oxide which is air propelled through a 0.25 inch diameter boron carbide nozzle at a pressure of 50 to 70 psig. This step of surface texturing enhances adhesion of a sputtering coating onto the treated components thereby reducing the likelihood of particles being introduced to the work piece or wafer on an unpredictable basis. Since the surface texturing is a coarse process, particles of varying sizes are present on the component surfaces. Thus, the components are next subjected to a particle removal operation shown as practiced in a two step removal operation in the drawing shown as macroparticulate removal step 20 followed by microparticulate removal step 21.

The large or gross particles considered to be those greater than 10 microns, are removed using air atomized deionized water having a minimum 15.0 megohm resistivity. The water is directed at the component surfaces at 80 to 100 psig in an enclosed pressure flush cabinet. The components are then immediately transferred to a micro-particle removal station and are not allowed to dry between process steps. The submicron particles are removed by immersion in a high purity deionized water bath shown as block 22 also having a minimum 15.0 megohm purity. The water bath is equipped with bottom mounted ultra sonic. transducers. The components are immersed for minimum of two minutes over the transducers and rotated 180 degrees after the first minute.

The water in the ultrasonic tank is continually circulated and filtered with resistivity measurements being taken continually. In the preferred embodiment, the ultrasonic tank is operated at 40 Khz with a power level of 4 to 6 watts per square inch. The ultrasonic tank is located in a clean room, as shown by the dashed lines in the FIGURE, wherein the components are rinsed in deionized water and then are blown dry with filtered nitrogen. Next, the components are subjected to a baking for up to 3 hours in an oven 24 having a nitrogen stream flowing therethrough. The baking time varies within the range of one to three hours at 235 to 275 degrees F. After a visual inspection, the components are placed in a bag purged with filtered nitrogen and then vacuum evacuated followed by heat sealing. The cleaned and bagged components are then taken out of the clean room and returned to the location of the host equipment.

In the foregoing discussion, it is to be noted that the stripping takes place at below ambient temperature and utilizes a stripping solution that does not include hydrofluoric acid. Thus, the stripping activity can be effectively controlled and completed within a reasonable period of time. The stripping action involving titanium and compounds thereof is an exothermic reaction tending to elevate the temperature of the stripping bath. It has been found that operating the ammonium hydroxide-hydrogen peroxide bath at ambient temperatures causes the bath to rise in temperature rapidly. If the bath temperature should reach the 75 to 80 degree F. range during the stripping operation, the bath causes an acceleration in the rate of exothermic reaction and can rise 100 degrees F. in temperature in one minute. Not only does this condition damage the parts being processed, the bath boils and emits ammonia which may require closure of the facility. In the practice of the present method, a closed cycle cooling system is used to maintain the bath within the 40 to 55 degree F. range for normal operation. It has been found that a failure to continuously remove heat allows the stripping bath to rise to ambient temperature and the stripping action becomes difficult to regulate and tends to etch the substrate. As the temperature rises above ambient, the stripping accelerates followed by the bath prematurely exhausting its chemical activity.

The present method has been successfully employed with aluminum, stainless steel, ceramic, and quartz substrates. Surface texturing is normally omitted in treating non metallic substrates. The treated substrates are free of deposited material and surface contamination and are ready for recycled use in the host equipment. In addition, the exposed component surfaces are textured so that the deposition taking place during continued usage adheres to the exposed surfaces to provide a reduced level of contamination during the manufacturing process.

While the above description has referred to a specific embodiment of the invention, it is to be recognized that variations and modifications may be made therein without departing from the scope of the invention as claimed.

I claim:

1. A method for the removal of deposited material from equipment components used in a vapor deposition process, said method comprising the steps of:
   a) immersing the components in an aqueous bath 5 to 8% by volume of ammonia hydroxide and 38 to 42% by volume of hydrogen peroxide;
   b) maintaining said bath at a temperature below ambient during immersion of said components;
   c) removing the components from said bath;
   d) subjecting the surface of the components to an acid etch, and
   e) applying a rinsing fluid to the surfaces of the components.

2. The method in accordance with claim 1 wherein the step of maintaining said bath at a temperature below ambient comprises maintaining the temperature within the range of 40 to 55 degrees F.

3. The method in accordance with claim 1 wherein the acid etch comprises an aqueous solution including nitric acid and hydrofluoric acid.

4. The method in accordance with claim 3 wherein said acid etch comprises a solution having the following compositional range by volume: nitric acid 28 to 32%, hydrofluoric acid 2 to 4% and the balance water.

5. The method in accordance with claim 1 further comprising the step of imparting surface texture to the components following the acid etch thereof.

6. The method in accordance with claim 5 wherein the step of imparting surface texture comprises exposing selected surfaces of the components to an abrasive stream to produce a minimum surface roughness of approximately 200 microinches.

7. The method in accordance with claim 6 wherein the step of applying a rinsing fluid includes the steps of subjecting the components to a pressurized stream of water and then immersing the components in an ultrasonic bath.

8. The method in accordance with claim 7 wherein the components are immediately immersed in the ultrasonic bath following being subjected to the pressurized stream.

9. The method in accordance with claim 8 further comprising the step of drying the component in a stream of nitrogen.

10. The method in accordance with claim 9 wherein the step of drying takes place at an elevated temperature.

11. The method in accordance with claim 10 wherein said elevated temperature is within the range of 235 to 300 degrees F.

12. A method for the removal of deposited material from the surface of components used in vapor deposition processes, said method comprising the steps of:

a) immersing the components in a bath consisting essentially the following constituents by volume percent: ammonium hydroxide 5 to 8%, hydrogen peroxide 38 to 42% and the balance water;

b) maintaining said bath at a temperature within the range of 40 to 55 degrees F., during immersion of said components;

c) removing the components from the bath;

d) subjecting the surface of the components to an acid etch comprised of the following constituents by volume percent: nitric acid 28 to 32%, hydrofluoric acid 2 to 4% and the balance water;

e) contacting the components with water to remove the acid etch;

f) imparting surface texture to selected surfaces of the components; and g) applying a rinsing fluid to the surfaces of the components.

13. The method in accordance with claim 12 wherein the step of imparting surface texture comprises exposing selected surfaces of the components to an abrasive stream to produce a minimum surface roughness of approximately 200 microinches.

14. The method in accordance with claim 13 wherein the step of applying a rinsing fluid includes the steps of subjecting the components to a pressurized stream of water and then immersing the parts in an ultrasonic bath.

* * * * *

UNITED STATES PATENT AND TRADEMARK OFFICE
CERTIFICATE OF CORRECTION

PATENT NO. : 5,660,640
DATED : August 26, 1997
INVENTOR(S) : David P. Laube

It is certified that error appears in the above-identified patent and that said Letters Patent is hereby corrected as shown below:

Column 6, claim 1, should read as follows:

1. A method for the removal of deposited material from equipment components used in a vapor deposition process, said method comprising the steps of:

a) immersing the components in an aqueous bath consisting essentially of 5 to 8% by volume of ammonia hydroxide and 38 to 42% by volume of hydrogen peroxide;
b) maintaining said bath at a temperature below ambient during immersion of said components;
c) removing the components from said bath;
d) subjecting the surface of the components to an acid etch, and
e) applying a rinsing fluid to the surfaces of the components.

Signed and Sealed this

Sixteenth Day of December, 1997

*Attest:*

BRUCE LEHMAN

*Attesting Officer*          *Commissioner of Patents and Trademarks*